(12) United States Patent
Zou et al.

(10) Patent No.: US 9,419,005 B2
(45) Date of Patent: Aug. 16, 2016

(54) SEMICONDUCTOR DEVICE, RELATED MANUFACTURING METHOD, AND RELATED ELECTRONIC DEVICE

(71) Applicant: Semiconductor Manufacturing International (Shanghai) Corporation, Shanghai (CN)

(72) Inventors: Lujun Zou, Shanghai (CN); Yun Yang, Shanghai (CN); Shaobin Li, Shanghai (CN); Shengfen Chiu, Shanghai (CN)

(73) Assignee: Semiconductor Manufacturing International (Shanghai) Corporation (CN)

( * ) Notice: Subject to any disclaimer, the term of this patent is extended or adjusted under 35 U.S.C. 154(b) by 0 days.

(21) Appl. No.: 14/578,937

(22) Filed: Dec. 22, 2014

(65) Prior Publication Data
US 2015/0340375 A1    Nov. 26, 2015

(30) Foreign Application Priority Data

May 23, 2014  (CN) .......................... 2014 1 0220163

(51) Int. Cl.
| | |
|---|---|
| *H01L 27/105* | (2006.01) |
| *H01L 27/115* | (2006.01) |
| *H01L 29/49* | (2006.01) |
| *H01L 21/28* | (2006.01) |

(52) U.S. Cl.
CPC .... *H01L 27/11539* (2013.01); *H01L 21/28273* (2013.01); *H01L 27/11521* (2013.01); *H01L 27/11536* (2013.01); *H01L 29/4975* (2013.01)

(58) Field of Classification Search
CPC ............ H01L 27/10873; H01L 27/105; H01L 27/1052
USPC ........................................... 438/266; 257/355
See application file for complete search history.

(56) References Cited

U.S. PATENT DOCUMENTS

| | | | | |
|---|---|---|---|---|
| 2004/0065961 | A1* | 4/2004 | Funakoshi | ...... H01L 21/823871 257/774 |
| 2004/0121548 | A1* | 6/2004 | Fishburn | ........... H01L 21/31053 438/279 |
| 2004/0259298 | A1* | 12/2004 | Graf | ...................... H01L 27/105 438/197 |
| 2013/0005098 | A1* | 1/2013 | Yamada | ............ H01L 21/28518 438/264 |

* cited by examiner

*Primary Examiner* — Cuong Q Nguyen
*Assistant Examiner* — Tong-Ho Kim
(74) *Attorney, Agent, or Firm* — Innovation Counsel LLP

(57) ABSTRACT

A method for manufacturing a semiconductor device may include the following steps: preparing a stacked structure; processing the stacked structure to form a first gate structure and a preliminary structure; forming a dielectric material layer that covers at least the first gate structure; forming a dielectric layer using the dielectric material layer, such that a portion of the dielectric layer is positioned between the first gate structure and the preliminary structure; performing an annealing process on at least one of the dielectric material layer and the dielectric layer; processing the preliminary structure to form a second gate structure; and after the annealing process has been performed, forming a first metal silicide member on the second gate structure and/or forming a second metal silicide member on an active region associated with the second gate structure.

20 Claims, 8 Drawing Sheets

SEMICONDUCTOR DEVICE, RELATED MANUFACTURING METHOD, AND RELATED ELECTRONIC DEVICE

CROSS-REFERENCE TO RELATED APPLICATION

This application claims priority to and benefit of Chinese Patent Application No. 201410220163.0, filed on 23 May 2014, the Chinese Patent Application being incorporated herein by reference in its entirety.

BACKGROUND OF THE INVENTION

The present invention is related to a semiconductor device, a method for manufacturing the semiconductor device, and an electronic device that includes the semiconductor device.

In a process for manufacturing a semiconductor device, such as a memory device, a dielectric layer may be formed for insulating conductive elements, such as gate electrodes. For optimizing one or more properties of the dielectric layer, an annealing process may be performed. Nevertheless, the high temperature of the annealing process may negatively affect some elements, such as metal silicide elements, that have been formed before the annealing process. As a result, the quality of the semiconductor device may be unsatisfactory.

SUMMARY

An embodiment of the present invention may be related to a method for manufacturing a semiconductor device, such as a memory device. The method may include the following steps: preparing a stacked structure; processing the stacked structure to form a first gate structure and a preliminary structure; forming a dielectric material layer that may cover at least the first gate structure (and the preliminary structure); forming a dielectric layer using the dielectric material layer, such that the first gate structure may be positioned between a first dielectric portion of the dielectric layer and a second dielectric portion of the dielectric layer, and such that the first dielectric portion of the dielectric layer may be positioned between the first gate structure and the preliminary structure; performing an annealing process on at least one of the dielectric material layer and the dielectric layer; processing the preliminary structure to form a second gate structure; and after the annealing process has been performed, performing at least one of forming a first metal silicide member on the second gate structure and forming a second metal silicide member on an active region associated with the second gate structure.

The stacked structure may include a semiconductor substrate, a floating-gate material layer, a control-gate material layer, and a mask material layer. The floating-gate material layer may be positioned between the semiconductor substrate and the control-gate material layer. The control-gate material layer may be positioned between the floating-gate material layer and the mask material layer.

The first gate structure may be positioned in a cell region of the semiconductor device. The second gate structure may be positioned in a peripheral region of the semiconductor device. The cell region of the semiconductor device may be associated with a functional cell, such as a memory cell. The peripheral region of the semiconductor device may neighbor the cell region of the semiconductor device. Two portions of the semiconductor substrate may respectively correspond to (and may be configured for respective formation of) the cell region of the semiconductor device and the peripheral region of the semiconductor device.

The method may include forming two sidewall layers on two opposite sides of the first gate structure, such that the first gate structure may be positioned between the two sidewall layers. The dielectric material layer may be subsequently formed and may cover the sidewall layers. The method may include forming two lightly-doped drain regions in the substrate at the two opposite sides of the first gate structure after the sidewall layers have been formed. The method may include forming a source region and a drain region in the substrate at the two opposite sides of the first gate structure after the sidewall layers have been formed.

The method may include forming two sidewall layers on two opposite sides of the second gate structure after the annealing process has been performed. The second metal silicide member may directly contact one of the two sidewall layers.

The dielectric material layer may be formed using at least one of a high-aspect-ratio process, a spin coating process, and a flowable chemical vapor deposition process.

An excess portion of the dielectric material layer that is positioned higher than the first gate structure may be removed for forming the dielectric layer after the annealing process has been performed on the dielectric material layer. The excess portion of the dielectric material layer may be removed using at least one of a polishing process, e.g., a chemical-mechanical polishing (CMP) process, and an etch-back process.

The method may include forming a source region and a drain region in the substrate at two opposite sides of the second gate structure. The second metal silicide member may be formed on one of the source region and the drain region after the annealing process has been performed.

The second metal silicide member may be formed after the annealing process has been performed and may be positioned between the second gate structure and the first dielectric portion of the dielectric layer. The second metal silicide member may directly contact the first dielectric portion of the dielectric layer. A third metal silicide member may be formed on one of the source region and the drain region associated with the second gate structure after the annealing process has been performed. The second gate structure may be positioned between the third metal silicide member and the first dielectric portion of the dielectric layer.

The preliminary structure may have fewer material layers than the first gate structure. A height of the preliminary structure may be equal to a height of the first gate structure.

The second gate structure may be formed after the annealing process has been performed. The second gate structure may have fewer material layers than the first gate structure. A height of the second gate structure may be less than a height of the first gate structure. The second gate structure may be spaced from the first dielectric portion of the dielectric layer.

An embodiment of the present invention may be related to a semiconductor device, such as a memory device, manufactured using one or more of the aforementioned steps.

An embodiment of the present invention may be related to an electronic device that includes an electronic component and includes a semiconductor device. The semiconductor device may be manufactured using one or more of the aforementioned steps and may be electrically connected to the electronic component.

According to embodiments of the invention, in a process for manufacturing semiconductor devices, elements (e.g., metal silicide members) that are sensitive to or intolerant of annealing process conditions may be formed after one or more necessary annealing processes have been performed (and completed), such that the elements may not be negatively affected by annealing processes. Therefore, the quality of the elements may be substantially maintained in the manufacturing process. Advantageously, satisfactory quality of the semiconductor devices and a satisfactory yield of the manufacturing process may be substantially attained.

The above summary is related to some of many embodiments of the invention disclosed herein and is not intended to limit the scope of the invention.

DETAILED DESCRIPTION

Figure 1A:
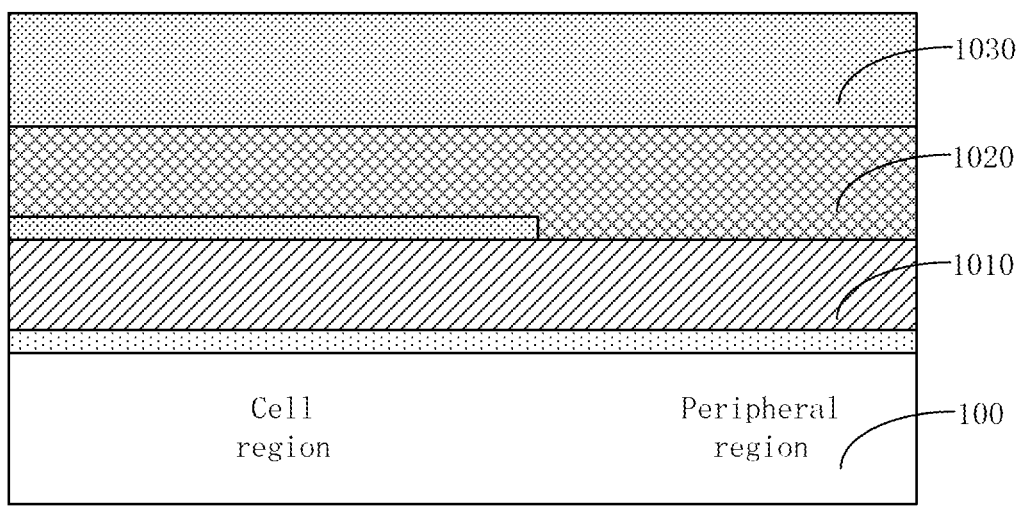
FIG. 1A, FIG. 1B, FIG. 1C, FIG. 1D, FIG. 1E, FIG. 1F, and FIG. 1G show schematic diagrams (e.g., schematic cross-sectional views) that illustrate elements and/or structures formed in a method for manufacturing a semiconductor device in accordance with one or more embodiments of the present invention.

Example embodiments of the present invention are described with reference to the accompanying drawings. As those skilled in the art would realize, the described embodiments may be modified in various different ways, all without departing from the spirit or scope of the present invention. Embodiments of the present invention may be practiced without some or all of these specific details. Well known process steps and/or structures may not have been described in detail in order to not unnecessarily obscure the present invention.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting the present invention. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements, should not be limited by these terms. These terms may be used to distinguish one element from another element. Thus, a first element discussed below may be termed a second element without departing from the teachings of the present invention. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may also be present between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the invention. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art related to this invention. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate". The term "conductive" may mean "electrically conductive".

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments of the invention may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out operations pertaining to embodiments of the invention. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the invention.

FIG. 1A, FIG. 1B, FIG. 1C, FIG. 1D, FIG. 1E, FIG. 1F, and FIG. 1G show schematic diagrams (e.g., schematic cross-sectional views) that illustrate elements and/or structures formed in a method for manufacturing a semiconductor device in accordance with one or more embodiments of the present invention. FIG. 2 shows a flowchart that illustrates steps in the method for manufacturing the semiconductor device in accordance with one or more embodiments of the present invention.

Referring to FIG. 2, the method may include steps S201, S202, S203, S204, and S205.

Figure 2:
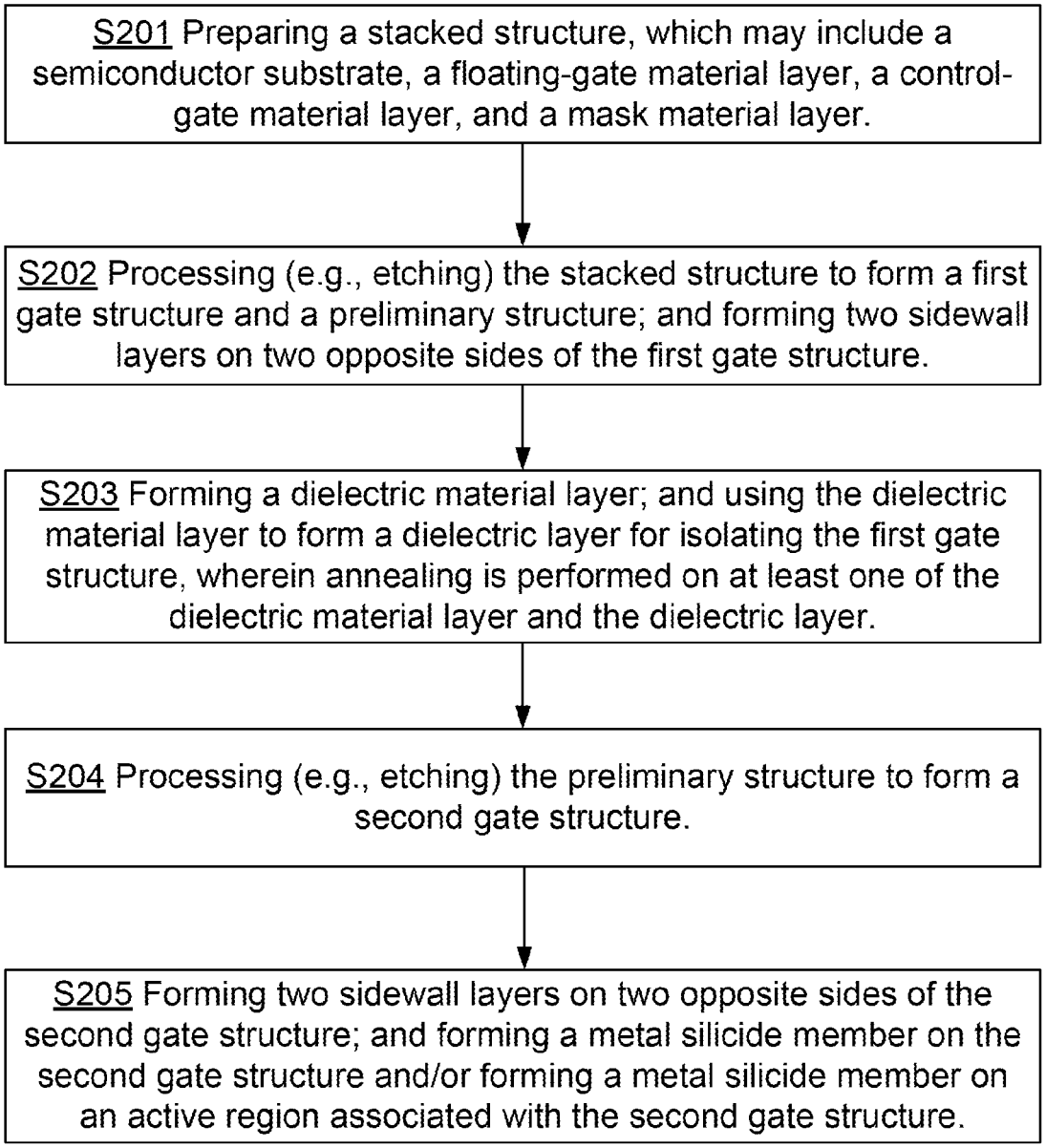
FIG. 2 shows a flowchart that illustrates steps in a method for manufacturing a semiconductor device in accordance with one or more embodiments of the present invention.

Referring to FIG. 2 and FIG. 1A, the step S201 may include preparing a stacked structure.

The stacked structure may include a semiconductor substrate 100, a floating-gate material layer 1010, a control-gate material layer 1020, and a mask material layer 1030 (e.g., a hard mask material layer). The floating-gate material layer 1010 may be positioned between the semiconductor substrate 100 and the control-gate material layer 1020. The control-gate material layer 1020 may be positioned between the floating-gate material layer 1010 and the mask material layer 1030.

The semiconductor structure 100 may be or may include one or more of a silicon substrate, a silicon-on-insulator substrate, etc. Two portions of the semiconductor substrate 100 may respectively correspond to (and may be configured for respective formation of) a cell region of the semiconductor device and a peripheral region of the semiconductor device. The cell region of the semiconductor device may be associated with a functional cell, such as a memory cell, and may include a control gate structure. The peripheral region of the semiconductor device may neighbor the cell region of the semiconductor device and may include a peripheral device, such as a peripheral transistor.

The stacked structure may include one or more alternative elements and/or one or more additional elements.

Figure 1B:
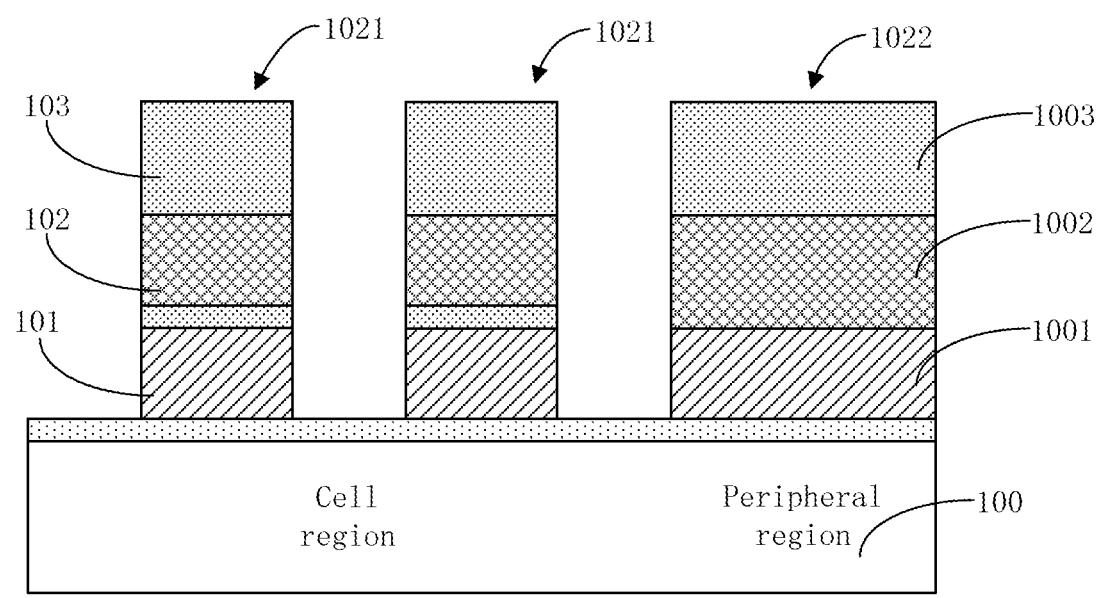

Referring to FIG. 2, FIG. 1A, and FIG. 1B, subsequent to the step S201, the step S202 may include processing (e.g., etching) the stacked structure to form one or more first-type gate structures 1021 and a preliminary structure 1022.

A first-type gate structure 1021 (or first gate structure 1021, for conciseness) may be a control gate structure configured to operate in a cell region of the semiconductor device. A first gate structure 1021 may include a floating-gate layer 101 (which may be part of the floating-gate material layer 1010), a control-gate layer 102 (which may be part of the control-gate material layer 1020), and a mask layer 103 (which may be part of the mask material layer 1030). The first gate structure 1021 may include one or more additional layers.

The preliminary structure 1022 may include a floating-gate layer 1001 (which may be part of the floating-gate material layer 1010), a control-gate layer 1002 (which may be part of the control-gate material layer 1020), and a mask layer 1003 (which may be part of the mask material layer 1030).

The preliminary structure 1022 may have fewer material layers than the first gate structure 1021. The height of the preliminary structure 1022 (above the substrate 100) may be equal to the height of the first gate structure 1021 (above the substrate 100).

Figure 1C:
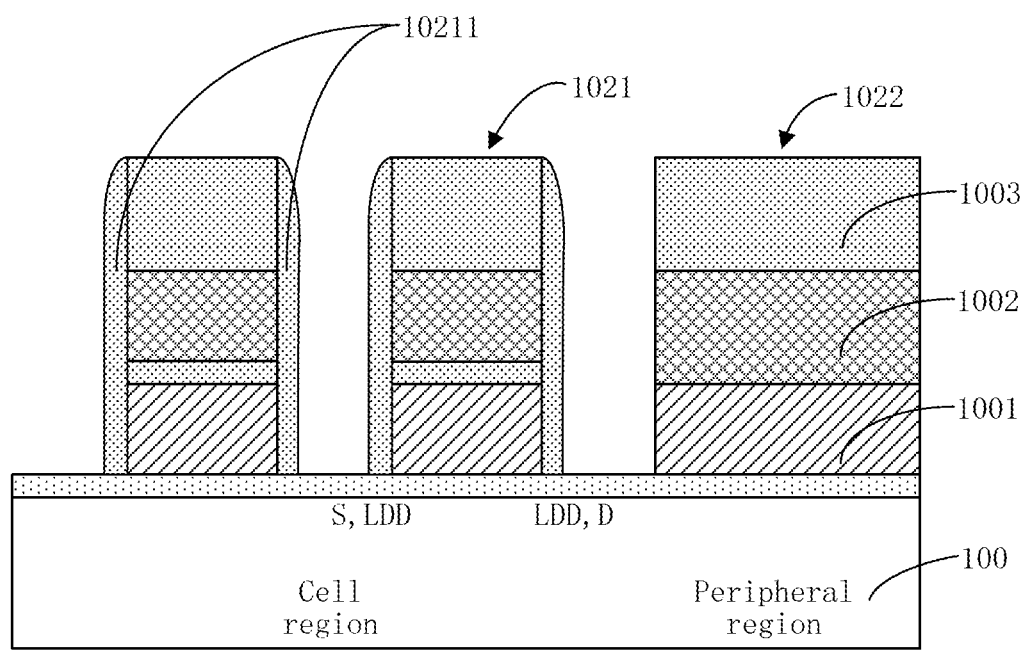

Referring to FIG. 2, FIG. 1B, and FIG. 1C, the step S202 may further include forming two sidewall layers 10211 on two opposite sides of a (or each) first gate structure 1021, such that the first gate structure 1021 may be positioned between two sidewall layers 10211. The sidewall layers 10211 may be formed of one or more of silicon oxide, silicon nitride, etc.

The method may include forming two lightly-doped drain (LDD) regions in the semiconductor substrate 100 at the two opposite sides of the first gate structure 1021 before the sidewall layers 10211 are formed. The method may include forming (e.g., through ion implantation) a source (S) region and a drain (D) region in the semiconductor substrate 100 at the two opposite sides of the first gate structure 1021 after the sidewall layers 10211 have been formed.

Figure 1D:
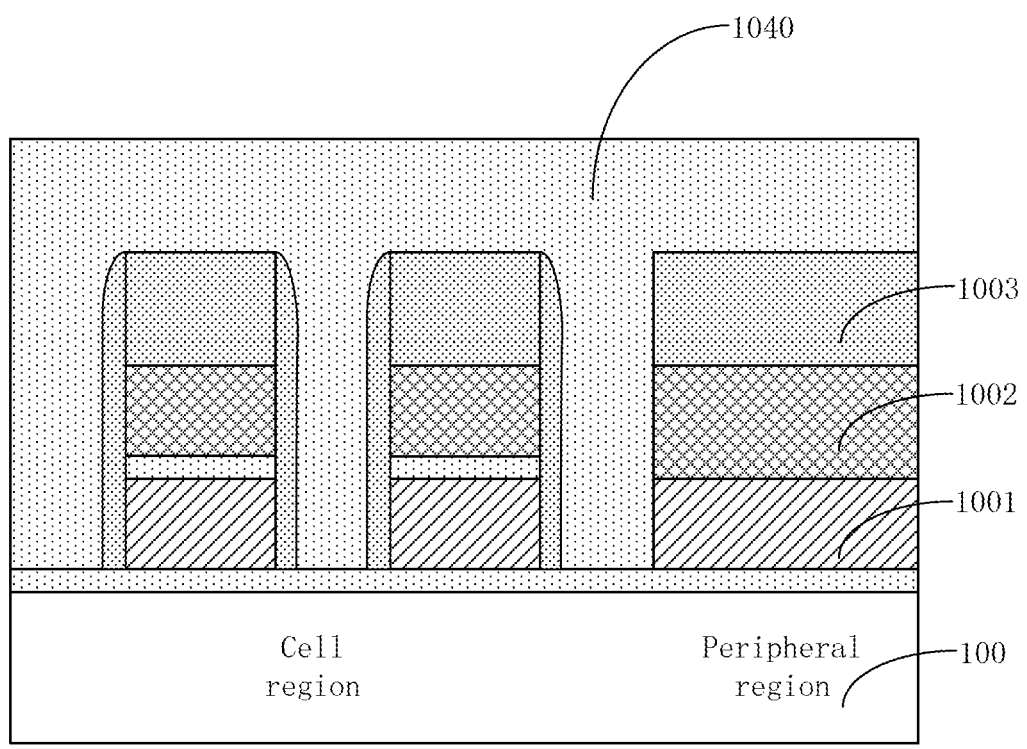

Referring to FIG. 2, FIG. 1C, and FIG. 1D, subsequent to the step S202, the step S203 may include forming a dielectric material layer 1040 that may cover the first gate structures 1021 and may fill the gaps between the first gate structures 1021. The dielectric material layer 1040 may cover the sidewall layers 10211. The dielectric material layer 1040 may cover the preliminary structure 1022 and may fill a gap between the preliminary structure 1022 and a first gate structure 1021.

The dielectric material layer 1040 may be formed of one or more of silicon oxide, etc. The dielectric material layer 1040 may be formed using at least one of a high-aspect-ratio process (HARP), a spin coating process (e.g., a spin-on glass or SOG process), a flowable chemical vapor deposition (FCVD) process, etc.

Figure 1E:
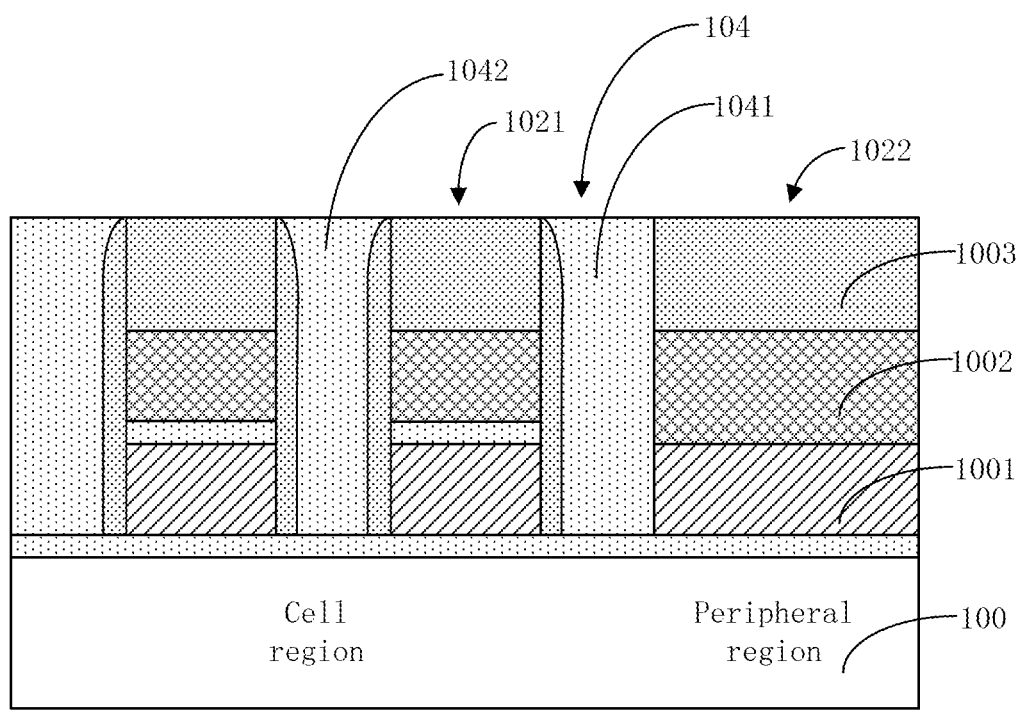

Referring to FIG. 2, FIG. 1D, and FIG. 1E, the step S203 may include removing an excess portion of the dielectric material layer 1040 that is positioned higher than the first gate structure 1021 for forming a dielectric layer 104. The excess portion of the dielectric material layer 1040 may be removed using one or more of a polishing process (e.g., a chemical-mechanical polishing or CMP process), an etch-back process, etc. A first gate structure 1021 may be positioned between and may directly contact a first dielectric portion 1041 of the dielectric layer 104 and a second dielectric portion 1042 of the dielectric layer 104. The first dielectric portion 1041 of the dielectric layer 104 may be positioned between, may directly contact, and may insulate the first gate structure 1021 and the preliminary structure 1022. The second dielectric portion 1042 of the dielectric layer 104 may be positioned between, may directly contact, and may insulate two first gate structures 1021.

For optimizing the performance and/or one or more properties of the dielectric layer 104, the step S203 may include performing an annealing process on at least one of the dielectric material layer 1040 and the dielectric layer 104. In an embodiment, an annealing process may be performed on the dielectric material layer 1040 before the formation of the dielectric layer 104, and no annealing process may be performed after the dielectric layer 104 has been formed, such that optimized properties of the dielectric layer 104 may not be substantially changed.

Elements formed before the annealing process, such as elements in one or more of the first gate structures 1021, the sidewall layers 10211, and the preliminary structure 1022 may be substantially tolerant of the annealing process. The quality of the elements may be substantially maintained through the annealing process. The annealing process may have minimum or substantially no negative effects on elements (e.g., metal silicide members) that are formed subsequent to the annealing process.

Figure 1F:
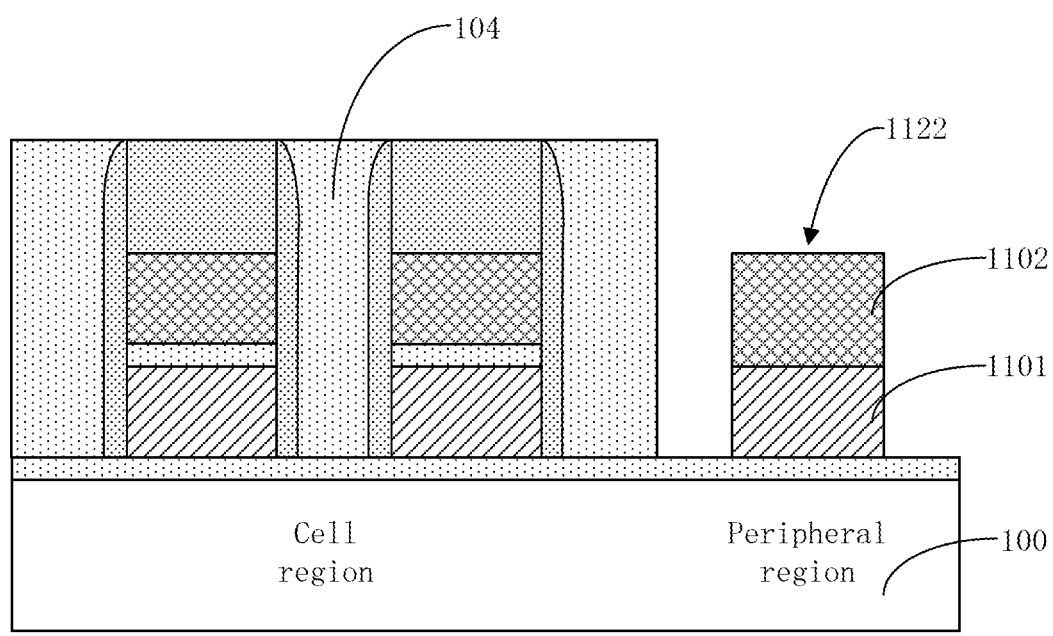

Referring to FIG. 2, FIG. 1E, and FIG. 1F, subsequent to the step S203, the step S204 may include processing (e.g., etching) the preliminary structure 1022 to form a second gate structure 1122. The second gate structure 1122 may be spaced from the first dielectric portion 1041 of the dielectric layer 104. The second gate structure 1122 may be a peripheral gate structure configured to operate as a part of a peripheral transistor in a peripheral region of the semiconductor device. The second gate structure 1122 may be formed after the annealing process (for optimizing the dielectric layer 104) has been performed (and completed); therefore, the second gate structure 1122 may not be substantially negatively affected by the annealing process.

The second gate structure 1122 may include a floating-gate layer 1101 (which may be part of the floating-gate layer 1001) and a control-gate layer 1102 (which may be part of the control-gate layer 1002). The second gate structure 1122 may have fewer material layers than the first gate structure 1021. A height of the second gate structure 1122 may be less than a height of the first gate structure 1021.

Figure 1G:
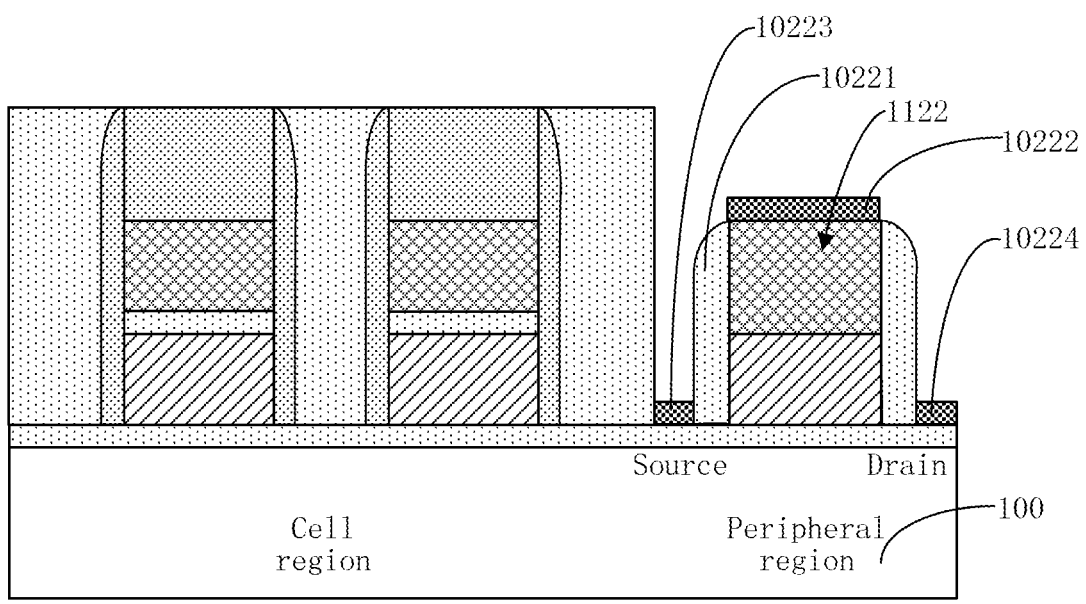

Referring to FIG. 2, FIG. 1F, and FIG. 1G, subsequent to the step S204, the step S205 may include forming two sidewall layers 10221 on two opposite sides of the second gate structure 1122. The sidewall layers 10221 may be formed of one or more of silicon oxide, silicon nitride, etc.

The step S205 may include forming one or more active regions in the peripheral region, which may include a source region and a drain region formed in the semiconductor substrate 100 at the two opposite sides of the second gate structure 1122.

Subsequent to the formation of the active region(s), the step S205 may include forming one or more of a metal silicide member 10222, a metal silicide member 10223, and a metal silicide member 10223 in the peripheral region. The one or more metal silicide members may be formed of one or more of nickel silicide, etc.

The metal silicide member 10222 may be formed on the second gate structure 1122.

The metal silicide member 10223 may be formed on an active region, e.g., one of the source region and drain region associated with the second gate structure 1122. The metal silicide member 10223 may directly contact one of the two sidewall layers 10221. The metal silicide member 10223 may be positioned between the second gate structure 1122 and the first dielectric portion 1041 of the dielectric layer 104. The metal silicide member 10223 may directly contact the first dielectric portion 1041 of the dielectric layer 104.

The metal silicide member 10224 may be formed on another active region, e.g., the other one of the source region and drain region associated with the second gate structure 1122. The second gate structure 1122 may be positioned between the metal silicide member 10224 and the first dielectric portion 1041 of the dielectric layer 104.

The metal silicide member(s) may be formed have the aforementioned annealing process has been performed (and completed). Therefore, the metal silicide member(s) may not be negatively affected by the annealing process, and the quality of the metal silicide member(s) may be substantially maintained. Advantageously, satisfactory quality of the semiconductor device may be substantially ensured.

An embodiment of the present invention may be related to a semiconductor device, such as a memory device, manufactured using one or more of the aforementioned steps. The memory device may be, for example, electron tunnel oxide flash memory device or a NOR flash memory device.

An embodiment of the present invention may be related to an electronic device that includes an electronic component and includes a semiconductor device. The semiconductor device may be manufactured using one or more of the aforementioned steps and may be electrically connected to the electronic component.

In an embodiment, the electronic device may be or may include one or more of a mobile phone, a tablet computer, a notebook computer, a netbook, a game console, a television, a video compact disc (VCD) player, a digital video disc (DVD) player, a navigation device, a camera, a camcorder, a voice recorder, an MP3 player, an MP4 player, a portable game device, etc.

In an embodiment, the electronic device may be or may include an intermediate product (e.g., a mobile phone main board) or module including a semiconductor device that may have one or more of the features and advantages discussed above.

According to embodiments of the invention, in a process for manufacturing semiconductor devices, elements (e.g., metal silicide members) that are sensitive to or intolerant of annealing process conditions may be formed after one or more necessary annealing processes have been performed (and completed), such that the elements may not be negatively affected by annealing processes. Therefore, the quality of the elements may be substantially maintained in the manufacturing process. Advantageously, satisfactory quality of the semiconductor devices and a satisfactory yield of the manufacturing process may be substantially attained.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A method for manufacturing a semiconductor device, the method comprising:
   preparing a stacked structure;
   processing the stacked structure to form a first gate structure and a preliminary structure;
   forming a dielectric material layer that covers at least the first gate structure;
   forming a dielectric layer using the dielectric material layer, such that a portion of the dielectric layer is positioned between the first gate structure and the preliminary structure;
   performing an annealing process on at least one of the dielectric material layer and the dielectric layer to optimize a property of the dielectric layer;
   after the annealing process has been performed, processing the preliminary structure to form a second gate structure; and
   after the second gate structure has been formed, performing no annealing process that can change the property of the dielectric layer on any elements of the semiconductor device, and performing at least one of forming a first metal silicide member on the second gate structure and forming a second metal silicide member on an active region associated with the second gate structure.

2. The method of claim 1, wherein the stacked structure includes a semiconductor substrate, a floating-gate material layer, a control-gate material layer, and a mask material layer, wherein the floating-gate material layer is positioned between the semiconductor substrate and the control-gate material layer, and wherein the control-gate material layer is positioned between the floating-gate material layer and the mask material layer.

3. The method of claim 1, wherein the first gate structure is positioned in a cell region of the semiconductor device, and wherein the second gate structure is positioned in a peripheral region of the semiconductor device.

4. The method of claim 1, further comprising: forming two sidewall layers on two opposite sides of the first gate structure, such that the first gate structure is positioned between the two sidewall layers, wherein the dielectric material layer is subsequently formed and covers the sidewall layers.

5. The method of claim 4, further comprising: after the sidewall layers have been formed, forming two lightly-doped drain regions at the two opposite sides of the first gate structure.

6. The method of claim 4, further comprising: after the sidewall layers have been formed, forming a source region and a drain region at the two opposite sides of the first gate structure.

7. The method of claim 1, further comprising: forming two sidewall layers on two opposite sides of the second gate structure after the annealing process has been performed.

8. The method of claim 7, wherein the second metal silicide member contacts one of the two sidewall layers.

9. The method of claim 1, wherein the dielectric material layer is formed using at least one of a high-aspect-ratio process, a spin coating process, and a flowable chemical vapor deposition process.

10. The method of claim 1, wherein an excess portion of the dielectric material layer that is positioned higher than the first gate structure is removed for forming the dielectric layer after the annealing process has been performed on the dielectric material layer.

11. The method of claim 10, wherein the excess portion of the dielectric material layer is removed using at least one of a polishing process and an etch-back process.

12. The method of claim 1, further comprising: forming a source region and a drain region at two opposite sides of the second gate structure, wherein the second metal silicide member is formed on one of the source region and the drain region after the annealing process has been performed.

13. The method of claim 1, wherein the second metal silicide member is formed after the annealing process has been performed and is positioned between the second gate structure and the portion of the dielectric layer.

14. The method of claim 1, wherein the second metal silicide member is formed after the annealing process has been performed, and wherein the second gate structure is positioned between the second metal silicide member and the portion of the dielectric layer.

15. The method of claim 1, wherein the preliminary structure has fewer material layers than the first gate structure.

16. The method of claim 15, wherein a height of the preliminary structure is equal to a height of the first gate structure.

17. The method of claim 1, wherein the second gate structure is formed after the annealing process has been performed.

18. The method of claim 1, wherein the second gate structure has fewer material layers than the first gate structure.

19. The method of claim 1, wherein the second gate structure is spaced from the portion of the dielectric layer.

20. A method for manufacturing a semiconductor device, the method comprising:
    preparing a stacked structure;
    processing the stacked structure to form a first gate structure and a preliminary structure;
    forming a dielectric material layer that covers at least the first gate structure;
    forming a dielectric layer using the dielectric material layer, such that a portion of the dielectric layer is positioned between the first gate structure and the preliminary structure;
    performing an annealing process on at least one of the dielectric material layer and the dielectric layer;
    processing the preliminary structure to form a second gate structure; and
    after the annealing process has been performed, forming a metal silicide member on an active region associated with the second gate structure, wherein the metal silicide member directly contacts the portion of the dielectric layer.

* * * * *